(12) United States Patent
Wong (10) Patent No.: US 9,543,282 B2
(45) Date of Patent: Jan. 10, 2017

(54) OPTICAL SENSOR PACKAGE

(71) Applicant: STMicroelectronics Pte Ltd., Singapore (SG)

(72) Inventor: Wing Shenq Wong, Singapore (SG)

(73) Assignee: STMicroelectronics Pte Ltd., Singapore (SG)

(*) Notice: Subject to any disclaimer, the term of this patent is extended or adjusted under 35 U.S.C. 154(b) by 155 days.

(21) Appl. No.: 14/083,102

(22) Filed: Nov. 18, 2013

(65) Prior Publication Data
US 2015/0137148 A1     May 21, 2015

(51) Int. Cl.
*H01L 25/16* (2006.01)
*H01L 23/00* (2006.01)

(52) U.S. Cl.
CPC ............ *H01L 25/167* (2013.01); *H01L 24/13* (2013.01); *H01L 24/16* (2013.01); *H01L 24/29* (2013.01); *H01L 24/32* (2013.01); *H01L 24/48* (2013.01); *H01L 24/73* (2013.01); *H01L 24/81* (2013.01); *H01L 2224/131* (2013.01); *H01L 2224/16225* (2013.01); *H01L 2224/2919* (2013.01); *H01L 2224/32225* (2013.01); *H01L 2224/48091* (2013.01); *H01L 2224/48227* (2013.01); *H01L 2224/73253* (2013.01); *H01L 2224/73265* (2013.01); *H01L 2224/81815* (2013.01); *H01L 2924/12041* (2013.01); *H01L 2924/12043* (2013.01); *H01L 2924/16151* (2013.01); *H01L 2924/181* (2013.01); *H01L 2924/18161* (2013.01); *H01L 2924/19107* (2013.01)

(58) Field of Classification Search
CPC ............ H01L 25/167; H01L 2924/181; H01L 2924/12041; H01L 2924/12043; H01L 2224/131; H01L 2224/73265; H01L 2224/81815; H01L 2224/2919; H01L 24/73; H01L 2224/16225; H01L 24/13; H01L 24/32; H01L 24/04
See application file for complete search history.

(56) References Cited

U.S. PATENT DOCUMENTS 8,350,216 B2     1/2013   Yao et al.
2009/0067143 A1*  3/2009  Lee ................... H01L 23/3128
                                                 361/764

(Continued)

*Primary Examiner* — John P Dulka
*Assistant Examiner* — Charles R Peters
(74) *Attorney, Agent, or Firm* — Seed Intellectual Property Law Group LLP (57) ABSTRACT

One or more embodiments are directed to system in package (SiP) for optical devices, including proximity sensor packaging. One embodiment is directed to an optical package that includes a stacked arrangement with a plurality of optical devices arranged over an image sensor processor die that is coupled to a first substrate. Between the two optical devices and the image sensor processor die there is provided at least a second substrate. In one embodiment, the optical package is a proximity sensor package and the optical devices include a light-emitting diode die and a light-receiving diode die. In one embodiment, the light-emitting diode die is secured to a surface of the second substrate and the light-receiving diode die is secured to a surface of a third substrate. The second and the third substrate may be secured to a surface of the image sensor processor die or to a surface of encapsulation material.

22 Claims, 11 Drawing Sheets

(56) References Cited

U.S. PATENT DOCUMENTS

2011/0057129 A1* 3/2011 Yao ................ G01S 7/4813
                                               250/552
2015/0060891 A1* 3/2015 Jin ................. H01L 31/173
                                               257/82

* cited by examiner

OPTICAL SENSOR PACKAGE

BACKGROUND

Technical Field

Embodiments of the present disclosure are directed to optical packages comprising optical devices. In particular, one or more embodiments are directed to packages comprising proximity sensors.

Description of the Related Art

Proximity sensors are used to detect the presence of nearby objects and are able to do so without physically touching the object. Proximity sensors may be utilized in various electronic devices, such as cameras, phones, including smartphones, vehicles, machinery, and other devices that may want to detect the presence of nearby objects. After detecting the presence of the nearby object, the electronic device may be configured to perform a function, such as move a mechanical feature to a secure position, couple or uncouple an electrical communication, or any other desired function.

Proximity sensors typically include a light-emitting diode (LED) and a light-receiving diode, such as a photodiode. The LED and photodiode are packaged together in a sensor package. Generally described, the LED emits radiation out a first opening in the sensor package. If an object is close to the sensor package, a suitable amount of the emitted radiation is reflected off of the object and back toward the sensor package. Some of the reflected radiation enters a second opening in the sensor package proximate the photodiode. The photodiode receives the reflected radiation and generates an electrical signal indicative of the received radiation.

The sensor package is typically in electrical communication with an image sensor processor. The image sensor processor is configured to cause the LED to emit the radiation and to receive the electrical signal from the photodiode indicative of the reflected radiation received. Typically, the image sensor processor is enclosed in its own package and both the sensor package and image sensor processor package are coupled to a board, such as a circuit board, and electrically coupled to each other through the board.

BRIEF SUMMARY

One or more embodiments are directed to a system in package (SiP) for optical devices, including proximity sensor packages. One embodiment is directed to an optical package that includes a stacked arrangement with a plurality of optical devices arranged over an image sensor processor that is coupled to a first substrate. Between the plurality of optical devices and the image sensor processor there is provided at least one second substrate. In one embodiment, the optical package is a proximity sensor package and the plurality of optical devices includes a light-emitting diode and a light-receiving diode. In one embodiment, the light-emitting diode and the light-receiving diode are secured to a surface of the same second substrate over the image sensor processor. In another embodiment, the light-emitting diode is secured to a surface of the second substrate and the light-receiving diode is secured to a surface of a third substrate, wherein both the second and the third substrates are located over the image sensor processor. In one embodiment, the second and/or the third substrates are secured to a back surface of the image sensor processor. In another embodiment, the second and/or third substrates are secured to a surface of encapsulation material surrounding the image sensor processor.

DETAILED DESCRIPTION

Embodiments are directed to optical packages, such as a system in package (SiP), for optical devices, including proximity sensors. The optical packages may include one or more optical devices and an image sensor processor within the package. In that regard, the optical package is capable of emitting the optical signal, receiving an optical signal, and analyzing electrical signals.

Figure 1A:
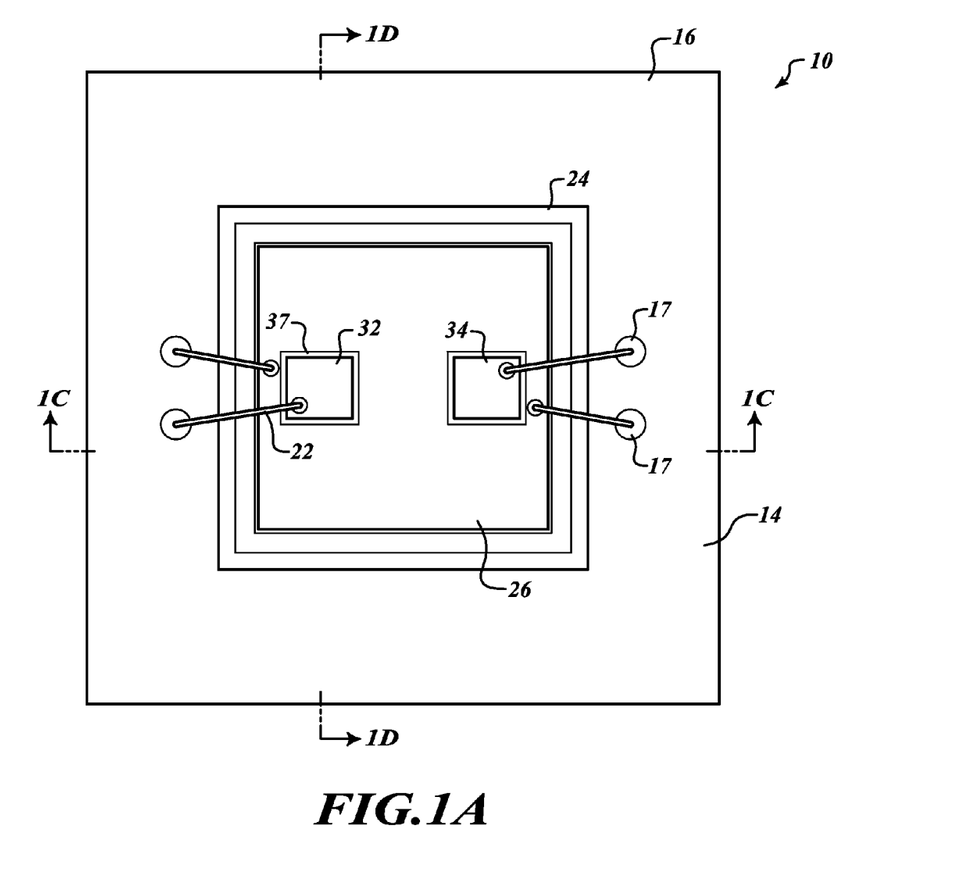
FIG. 1A is a top view of an optical package without a cap according to one embodiment of the invention.
Figure 1B:
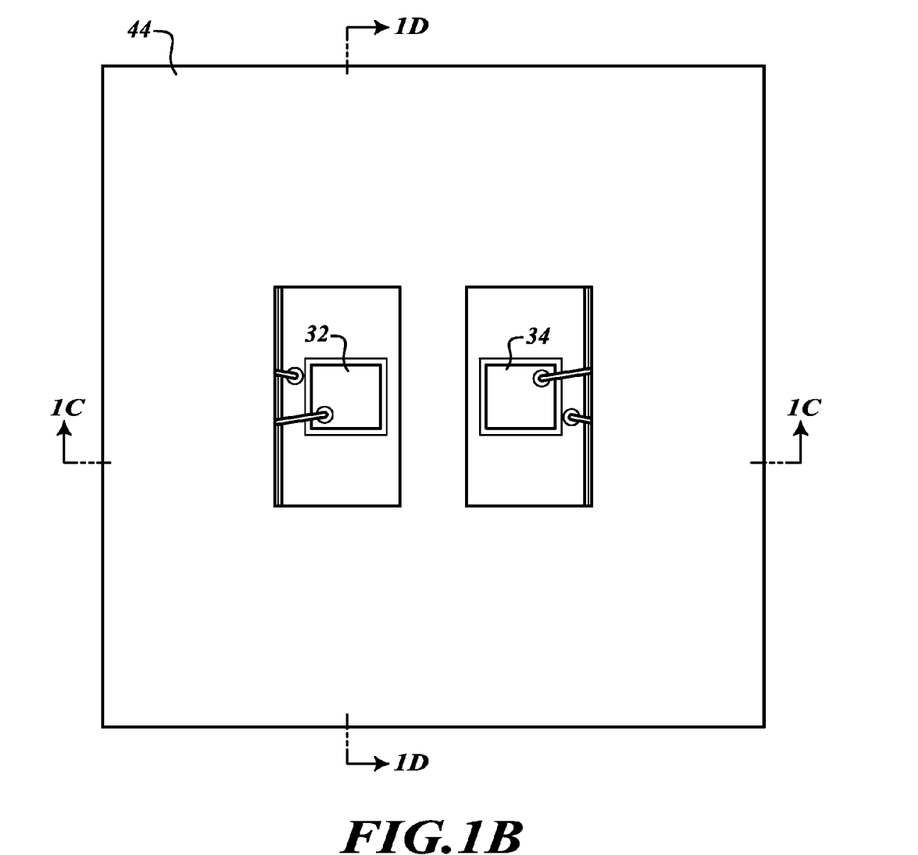
FIG. 1B is a top view of the optical package in FIG. 1A with a cap.
Figure 1C:
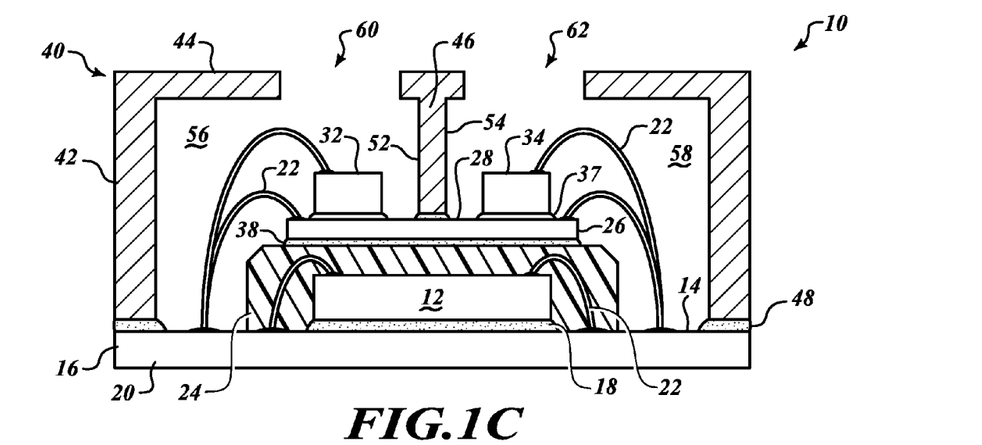
FIGS. 1C and 1D are cross-section views of the optical package of FIG. 1A with the cap.

FIGS. 1A-1D illustrate an optical package 10 according to one embodiment. As best shown in FIG. 1C the optical package 10 includes an image sensor processor die 12 secured to a first surface 14 of a first substrate 16. The image sensor processor die 12 includes circuitry to send, receive, and analyze electrical signals as is well known in the art. An upper surface of the image sensor processor die includes pads for electrically coupling the image sensor processor die to the first substrate 16.

Generally described, the first substrate 16 includes one or more insulative and conductive layers. The first surface 14 of the first substrate 16 includes pads 17 and a second surface 20 of the first substrate includes pads or lands (not shown). The pads on the first surface 14 are in electrical communication with one or more pads on the second surface 20 by conductive traces and/or vias formed in the first substrate 16. The second surface 20 of the first substrate 16 forms an outer surface of the optical package 10 and the lands on the second surface 20 are for electrically coupling the optical package 10 to another device or board (not shown).

The image sensor processor die 12 may be secured to the first surface 14 of the first substrate 16 by an adhesive material 18. The adhesive material 18 may be any material configured to hold the image sensor processor die 12 in place during assembly processing. For instance, the adhesive material 18 may be tape, paste, glue, or any other suitable material.

The image sensor processor die 12 is electrically coupled to the pads 17 on the first surface 14 of the first substrate 16 by conductive connectors, which in the illustrated embodiment are conductive wires 22. In that regard, a first end of a conductive wire 22 is coupled to the pad on the image sensor processor die 12 and a second end of the conductive wire 22 is coupled to a pad on the first surface 14 of the first substrate 16.

The image sensor processor die 12 and the conductive wires 22 are encapsulated by encapsulation material 24. The encapsulation material 24 is any insulative material configured to protect the image sensor processor die 12 and the conductive wires 22, such as from external elements including, but not limited to, those that may cause corrosion or shorting of the conductive materials therein. The encapsulation material 24 may be a molding compound, such as resin. In one embodiment, the encapsulation material 24 is a high-density mold resin which limits the amount of radiation that can pass therethrough.

A second substrate 26 having a first surface 28 and second surface 30 is secured to a surface of the encapsulation material 24 over the image sensor processor die 12. That is, the second surface 30 of the second substrate 26 is secured to the surface of the encapsulation material 24 by an adhesive material 38. The adhesive material 38 is any adhesive material configured to secure the second substrate 26 to the encapsulation material 24. The adhesive material 38 may be the same or different from the adhesive material 28 described above.

Generally described, the second substrate 26 includes one or more insulative and conductive layers as is well known in the art. In one embodiment, one or more of the insulative layers of the second substrate 26 may be formed from a light barrier material, such as black photoresist. The second substrate 26 may include pads formed on the first surface 28 of the second substrate 26. The pads of the second substrate 26 may be coupled to pads 17 of the first surface 14 of the first substrate 16, such as by conductive wires 22. In one embodiment, these conductive wires 22 are used for coupling the second substrate 26 to ground.

A light-emitting diode (LED) die 32 and a light-receiving diode die, such as a photodiode die 34, are secured to the first surface 28 of the second substrate 26 at a spaced apart distance from each other. The LED die 32 and the photodiode die 34 are secured by an adhesive material 37. The adhesive material 37 may be any adhesive configured to secure the dice 32 and 34 to the second substrate 26, including those identified above. The adhesive material 37 may be the same as or different from the adhesive material 18. The LED die 32 is configured to receive an electrical signal, such as a power signal from the image sensor processor die, and in response to receiving the signal, to emit radiation at a particular frequency or frequency range. In one embodiment, the LED die 32 emits infrared (IR) radiation. The photodiode die 34 is configured to receive radiation within the particular frequency range and to generate an electrical signal indicative of the received radiation.

The LED die 32 and the photodiode die 34 are electrically coupled to the first surface 14 of the first substrate 16 by conductive wires 22. For instance, a first end of a conductive wire 22 is coupled to a pad on the LED die 32 and a second end of the conductive wire 22 is coupled to a pad on the first surface 14 of the first substrate 16. Through the first substrate 16, the LED die 32 and the photodiode die 34 are in electrical communication with the image sensor processor die 12. In that regard, the LED die 32 may emit radiation in response to an electrical signal received from the image sensor processor die 12, and the photodiode die 34 may provide electrical signals to the image sensor processor die 12 for processing.

In the illustrated embodiment, the LED die 32 and the photodiode die 34 are located on the second substrate over the image sensor processor die 12, thereby forming a stacked arrangement. In that regard, the footprint of the optical package 10, that is the size of the first substrate 16, remains the same size as a previous image sensor processor optical package, while the height of the optical package 10 may be increased for incorporating all three dice within the same package.

Figure 1D:
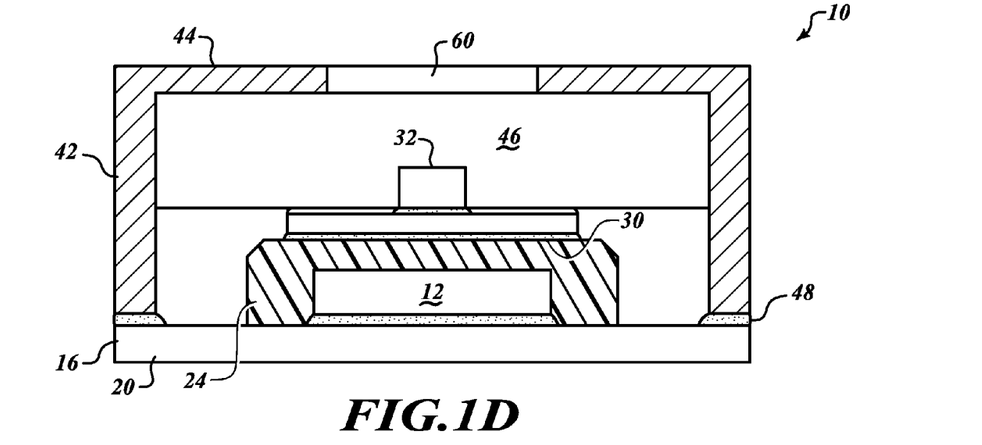

As shown in FIGS. 1B-1D, the optical package 10 further includes a cap 40 having sidewalls 42, a cover 44, and an innerwall 46. FIG. 1A illustrates a top down view of the optical package 10 without the cap 40, while FIG. 1B illustrates a top down view of the optical package 10 with the cap 40. The sidewalls 42 of the cap 40 are secured to the first surface 14 of the first substrate 16, and the innerwall 46 of the cap 40 is secured to the first surface 28 of the second substrate 26 at the spaced apart distance between the LED die 32 and the photodiode die 34. The cap 40 is secured by an adhesive material 48, which may be any adhesive material and may be different from or the same as those described above. In one embodiment, the adhesive material 48 is made from an adhesive material that is configured to form a light barrier, such as a black adhesive.

The innerwall 46 of the cap 40 has a first side 52 and a second side 54. The first side 52 of the innerwall 46 forms a first cavity 56 with a portion of the sidewalls 42 and cover 44 of the cap 40 in which the LED die 32 is located. The second side of the innerwall 46 forms a second cavity 58 with a portion of the sidewalls 42 of the cap 40 in which the photodiode die 34 is located.

Above the LED die 32, the cover 44 of the cap 40 includes a first through hole 60 that is positioned above the LED die 32 to allow radiation emitted from the LED die 32 to exit the optical package 10. Above the photodiode die 34, the cover 44 of the cap 40 includes a second through hole 62 that is positioned above the photodiode die 34 to allow radiation to enter the optical package 10 and be received by the photodiode die 34. The innerwall 46 of the cap 40 forms a light barrier between the LED die 32 and the photodiode die 34. That is, the cap 40 may be configured to limit radiation, or at least the radiation at the frequency range that the LED die 32 emits, from being transmitted therethrough. In one embodiment, the cap 40 is formed from liquid crystal plastic. In some embodiments, the adhesive material 48 that secures the innerwall 46 of the cap 40 to the first surface 28 of the second substrate 26 is a light barrier adhesive. In addition, the second substrate 26 itself may have a light barrier formed on its upper surface, such as black photoresist.

In operation, the image sensor processor die 12 is configured to cause the LED die 32 to emit radiation at a particular frequency, such as infrared. For instance, the image sensor processor die 32 may be configured to send a power signal to the LED die 32 through the second substrate 26. In response to receiving the power signal, the LED die 32 emits radiation, which travels through the first through hole 60 of the cap 40. At least some of the emitted radiation reflects off a surface of a nearby object and is directed back toward the optical package 10. At least some of the reflected radiation travels through the second through hole 62 of the cap 40 toward the photodiode die 34. The photodiode die 34 receives the reflected radiation, generates an electrical signal indicative of the reflected radiation, and sends the signal to the image sensor processor die 12. The image sensor processor die 12 is configured to determine the proximity of the surface of the nearby object that reflected the radiation. For instance, the image sensor processor die 12 may include a clock or timer configured to determine the time it takes the radiation emitted from the LED to be received by the photodiode die 34.

Figure 2A:
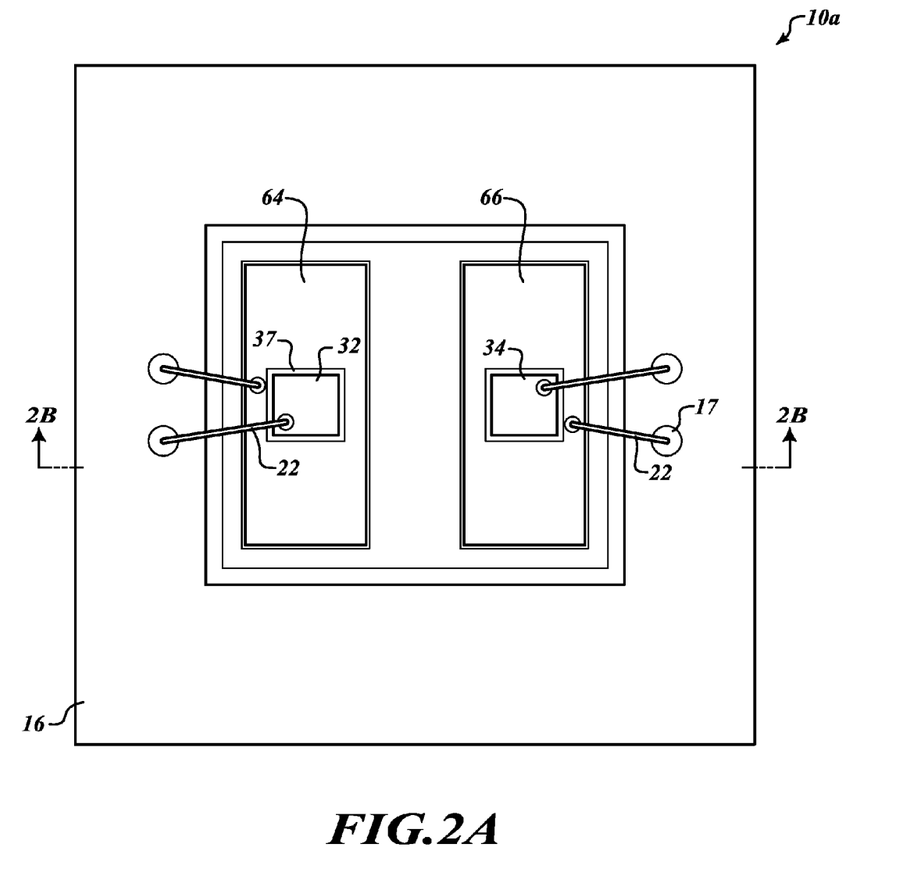
FIG. 2A is a top view of an optical package without a cap according to another embodiment of the invention.
Figure 2B:
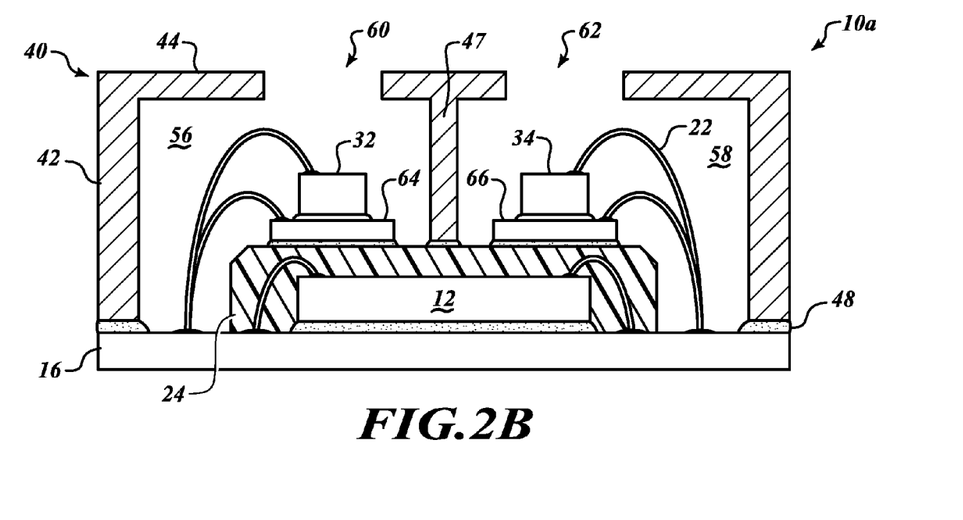
FIG. 2B is a cross-section view of FIG. 2A with a cap.

FIG. 2A shows a top down view of an optical package 10a without a cap 40 according to another embodiment and FIG. 2B shows a cross-section view of the optical package 10a with the cap 40. The optical package 10a of FIG. 2A is substantially similar in structure and function to the optical package 10 of FIG. 1A; however, the optical package 10a of FIG. 2A includes two distinct substrates 64, 66 rather than the single second substrate 26 of the optical package 10 of FIG. 1A. In that regard, the optical package 10a includes a second substrate 64 secured to the surface of the encapsulation material 24 and a third substrate 66 secured to the surface of the encapsulation material 24 at a spaced apart distance from the second substrate 64. In the illustrated embodiment, the LED die 32 is secured to the second substrate 64 and the photodiode die 34 is secured to the third substrate 66. As shown in FIG. 2B, an innerwall 47 of the cap 40 is secured to the surface of the encapsulation material 24, rather than the first surface 28 of the second substrate 26 as shown in the optical package 10 of FIG. 1C. In that regard, the innerwall 47 of the cap 40 of the optical package as shown in FIG. 1C is longer than the innerwall 46 of the cap 40 of the optical package as shown in FIG. 1A. It is to be appreciated that the longer innerwall 47 of the cap 40 may improve the light barrier between the first cavity 56 and the second cavity 58.

Figure 3:
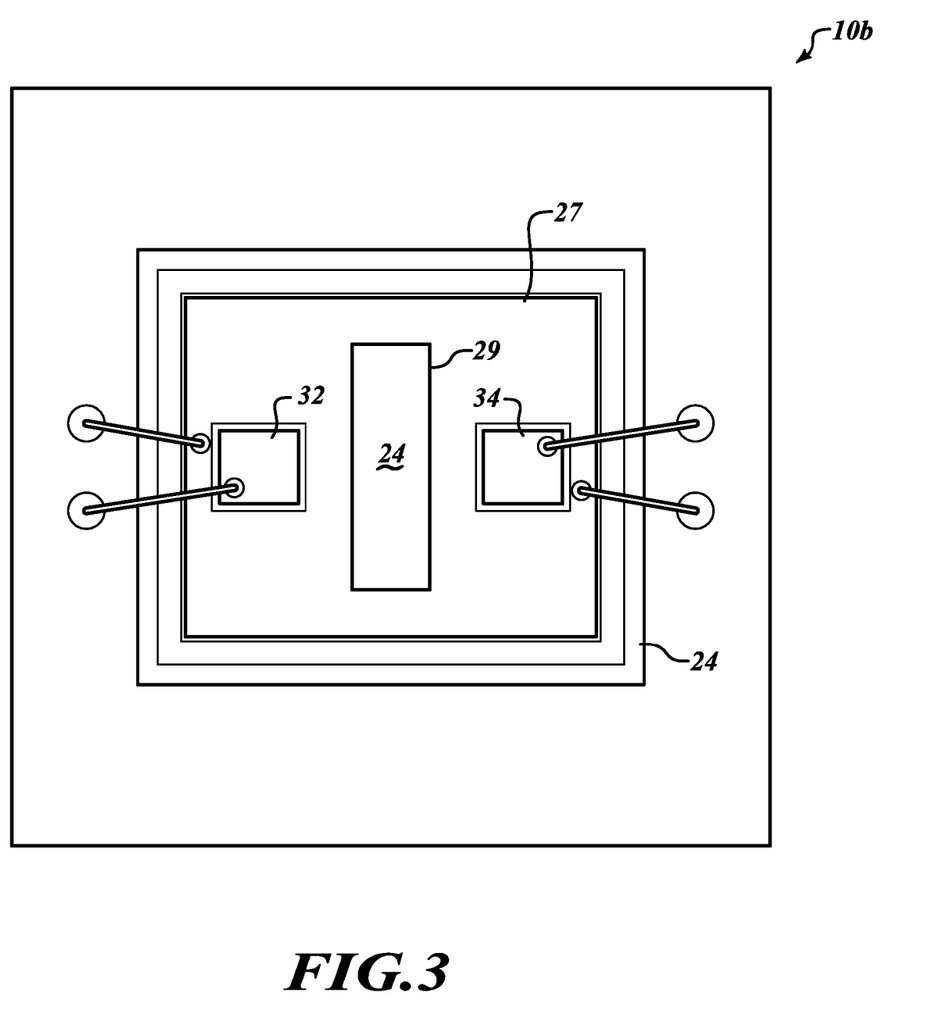
FIG. 3 is a top view of a cross-section of an optical package without a cap according to yet another embodiment of the invention.

FIG. 3 shows an optical package 10b that is substantially similar in structure and function to the optical package 10 of FIG. 1A; however, the second substrate 27 of the optical package 10b of FIG. 3 has a through hole 29 along a center portion of the second substrate 27, exposing the surface of the encapsulation material 24 therebelow. Although not shown, it is to be appreciated that at least a portion of the innerwall 46 of the cap 40 is secured to the surface of the encapsulation material 24 and the remaining portion of the innerwall 46 is secured to the surface of the second substrate 27, such as at the portion nearest the sidewalls 42. In such an embodiment, the innerwall 46 has a middle portion that is of length to secure to the encapsulation material 24 and an outer portion that is of a length to secure to the surface of the second substrate 27. In that regard, the middle portion of the innerwall 46 is longer than the outer portion.

Figure 4:
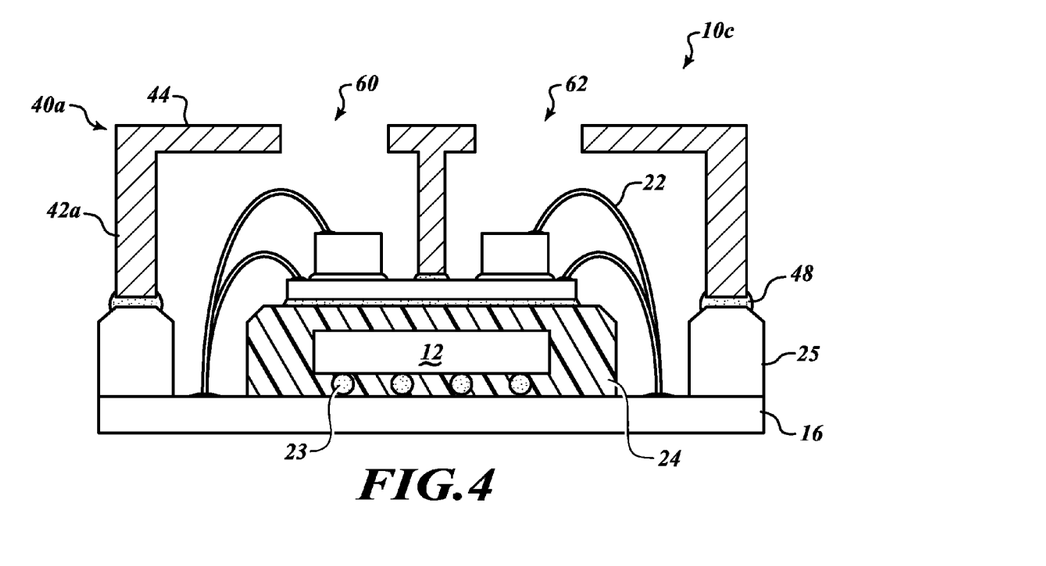
FIG. 4 is a cross-section view of an optical package according to yet another embodiment of the invention.

FIG. 4 illustrates an optical package 10c according to another embodiment. The optical package 10c of FIG. 4 is substantially similar in structure and function to the optical package 10 of FIGS. 1A-1D. A first difference of the optical package 10c of FIG. 4 compared to the optical package 10 of FIG. 1A-1D is that the image sensor processor die 12 of FIG. 4 is coupled to the first surface 14 of the first substrate 16 by flip chip configuration as is well known in the art. That is, the pads of the image sensor processor die 12 are secured to pads of the first substrate 16 by conductive connectors, such as solder balls 23. In that regard, the solder balls 23 are located between pads of the surface of the image sensor processor die 12 and pads of the first surface of the substrate 16, and provide electrical connection therebetween.

As shown in FIG. 4, encapsulation material 25 is formed at a perimeter of the first substrate 16 and surrounds the image sensor processor die 12. The encapsulation material 25 may be the same material as the encapsulation material 24 that is located around the image sensor processor die 12 as described above. Alternatively, it may be a different type of encapsulation material. In one embodiment, the encapsulation material 25 may be formed from a molded resin. The cap 40a is substantially similar to the cap 40 of FIG. 1; however, in view of the encapsulation material 25 around the perimeter of the first substrate 16, the sidewalls 42a of the cap 40a may be shorter than in the embodiment of FIGS. 1A-1D.

Figure 5:
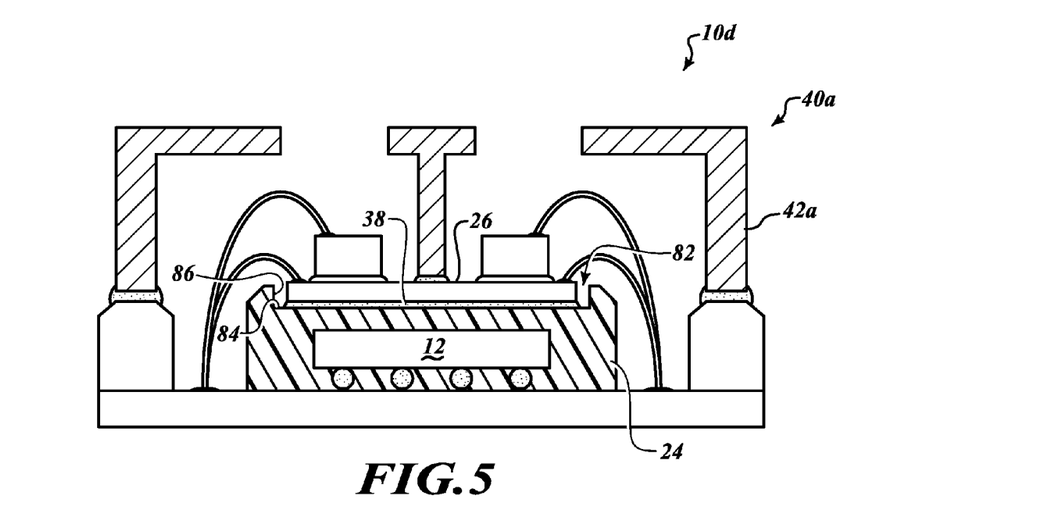
FIG. 5 is a cross-section view of an optical package according to yet another embodiment of the invention.

FIG. 5 illustrates an optical package 10d according to yet another embodiment. The optical package 10d of FIG. 5 is similar in structure and function to the optical package 10c of FIG. 4, except that a recess 82 is formed in the surface of the encapsulation material 24 that is located around the image sensor processor die 12. The recess 82 forms a base surface 84 and sidewalls 86 in the encapsulation material 24. The second substrate 26 is secured to the base surface 84 of the encapsulation material 24. The sidewalls 86 may assist in securing the second substrate 26 to the base surface 84 of the encapsulation material 24 by blocking the flow of the adhesive material 38 along the surface. It is to be appreciated that this arrangement may result in the height of the optical package 10d being smaller than the height of the optical package 10c of FIG. 4.

Figure 6:
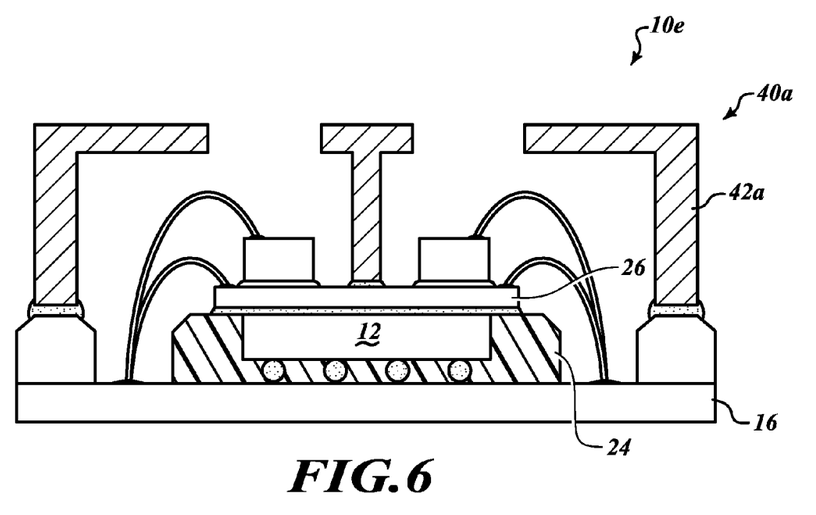
FIG. 6 is a cross-section view of an optical package according to yet another embodiment of the invention.

FIG. 6 illustrates an optical package 10e according to yet another embodiment. The optical package 10e of FIG. 6 is identical to the optical package 10c of FIG. 4, except that in the optical package 10e of FIG. 6, the encapsulation material 24 is located along side surfaces of the image sensor processor die 12 and not on a back surface thereof. In this embodiment, the second substrate 26 is secured to the back surface of the image sensor processor die 12. As shown in FIG. 6, the second substrate 26 may also be secured to a portion of the encapsulation material 24. In some embodiments, the encapsulation material 24 is removed from the back surface of the image sensor processor die 12.

Figure 7A:
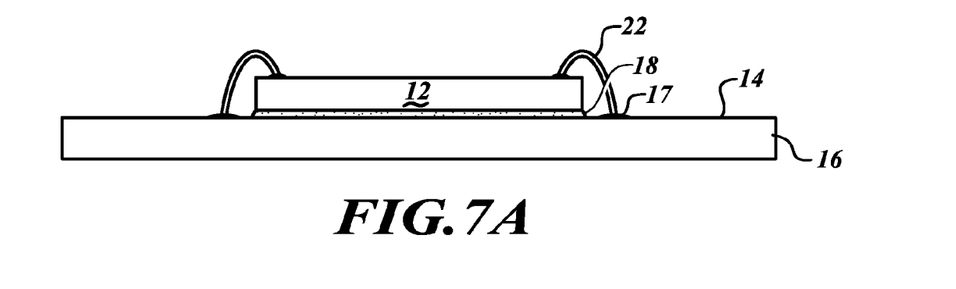
FIGS. 7A-7E illustrate the steps for manufacturing the optical package of FIGS. 1A-1D according to one embodiment of the invention.

FIGS. 7A-7E illustrate a method of making the optical package 10 of FIGS. 1A-1D according to one embodiment. As shown in FIG. 7A an image sensor processor die 12 is attached to the first surface 14 of the first substrate 16 using an adhesive material 18. The image sensor processor die 12 is electrically coupled to the first surface 14 of the first substrate 16. In the illustrated embodiment, electrical coupling is completed by coupling a first end of a conductive wire 22 to a pad of the image sensor processor die 12 and a second end of the conductive wire 22 to a pad 17 of the first substrate 16. In the embodiments of FIGS. 4-6, it is to be appreciated that electrical coupling and mechanical coupling may be provided by reflowing solder balls between the surface of the image sensor processor die 12 and pads of the first surface 14 of the first substrate 16.

Figure 7B:
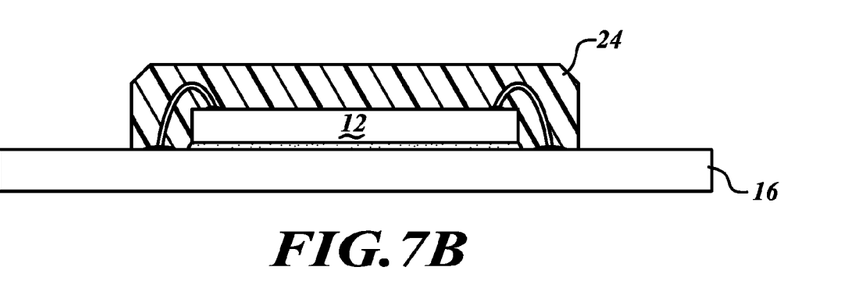

As shown in FIG. 7B, encapsulation material 24 is provided around the image sensor processor die 12 and the conductive wires 22. This may be completed in a molding process in which liquid resin is provided into a mold. In the embodiments of FIGS. 4-6, it is to be appreciated that the outer perimeter encapsulation material 25 may, in some embodiments, be performed during this step. Although not shown, a surface of the encapsulation material 24 may be planarized or the recess 82 may be formed in the encapsulation material 24 as shown in FIG. 5. In the embodiment shown in FIG. 6, the encapsulation material 24 may be removed until the back surface of the image sensor processor die 12 is exposed.

Figure 7C:
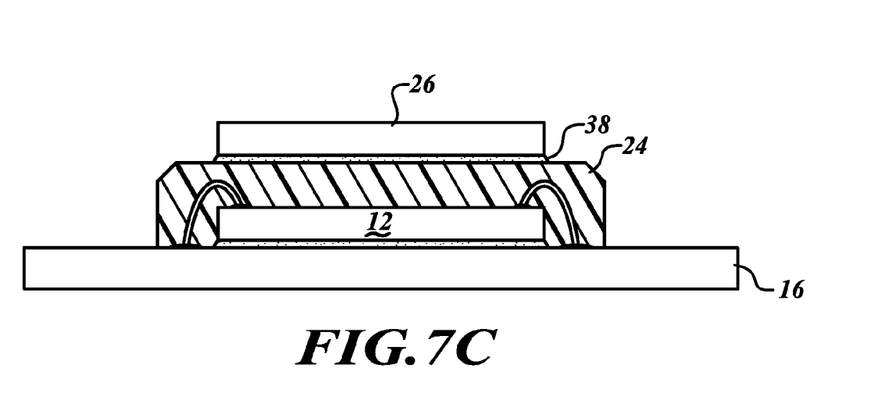
Figure 7D:
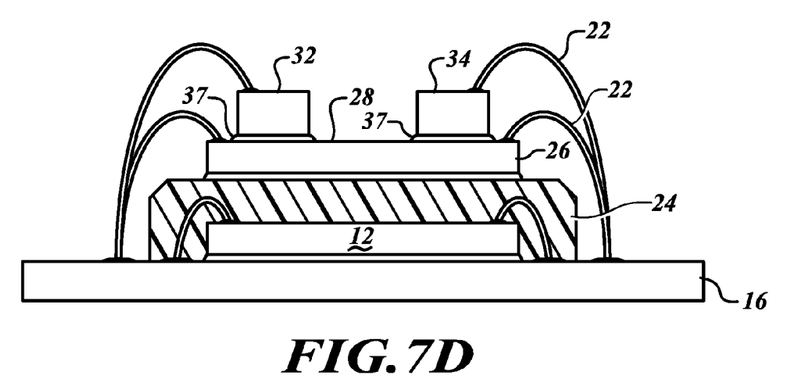
Figure 7E:
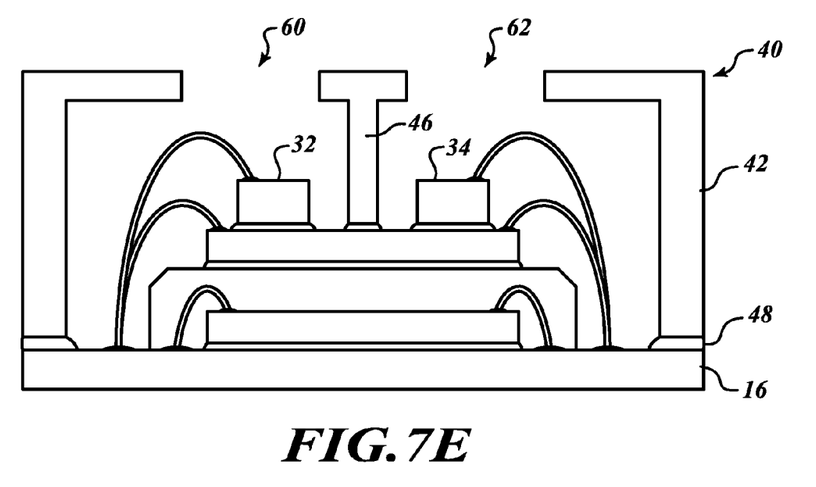

As shown in FIG. 7C, the second substrate 26 may be secured to the surface of the encapsulation material 24 using adhesive material 38, such as any of those discussed above. As shown in FIG. 7D, the LED die 32 and the photodiode die 34 are secured to the first surface 28 of the second substrate 26 at a spaced apart distance from each other. The LED die 32, the photodiode die 34, and the second substrate 26 are electrically coupled to the first surface 14 of the first substrate 16 using conductive wires 22. As shown in FIG. 7E, the cap 40 is secured to the first surface 14 of the first substrate 16 outward of the image sensor processor die and the conductive wires 22. It is to be appreciated that in other embodiments, the cap 40 is secured to the encapsulation material 25 at the sidewalls 42 and/or to the surface of the encapsulation material 24.

One or more embodiments provide for a system in package. In that regard, the footprint of the system on a board is smaller than when two separate packages are used, one package for the optical dice and another package for the processor die.

Figure 8:
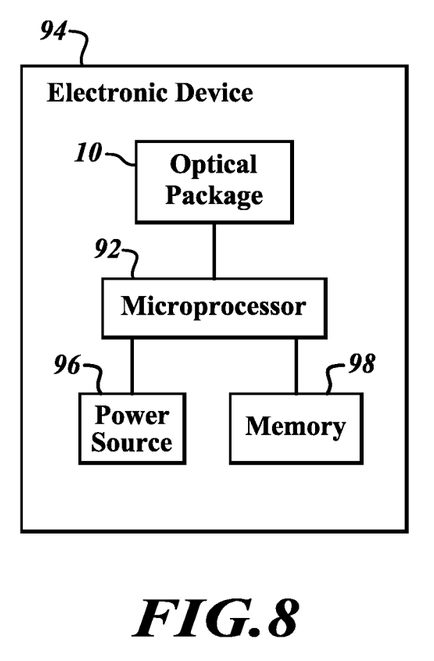
FIG. 8 illustrates a block diagram of an electronic device that includes the optical package of FIG. 1.

FIG. 8 shows an electronic device 94 comprising an optical package described herein, such as the optical package 10, coupled to a microprocessor 92. The microprocessor 92 is any circuit configured to receive or send electrical signals to the optical package 10. The electronic device 94 may further include a power source 96 configured to provide electric power for the device. The power source 96, which may be a battery, may be coupled to the microprocessor 92. The electric device 94 may also include a memory 110 coupled to or incorporated in the microprocessor 92.

In some embodiments, the electronic device 94 is a cell phone, smartphone, tablet, camera, and/or wearable computing that may be located in clothing, shoes, watches, glasses or other wearable structures. In some embodiments, the electronic device 94, or the optical package 10 itself, is located in a vehicle, such as boat and car, a robot, or any other moveable structure or machinery.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A proximity sensor comprising:
a first substrate having a first surface, a pad located on the first surface of the substrate;
a processor die having a pad, the processor die coupled to the first surface of the first substrate;
conductive connectors coupling the pad of the first substrate to the pad of the processor die;
encapsulation material around portions of the processor die;
a second substrate located over the processor die;
a third substrate located over the processor die;
a light-emitting diode die secured to a surface of the second substrate;
a light-receiving diode die secured to a surface of the third substrate;
a cap located around side surfaces of the light-emitting diode die and the light-receiving diode die, the cap having sidewalls and an innerwall, the innerwall optically separating the light-emitting diode die from the light-receiving diode die; and
adhesive material coupled to the innerwall of the cap and the sidewalls of the cap, the adhesive material coupling the innerwall of the cap to the encapsulation material between the first and second substrates and coupling the sidewalls of the cap to the first surface of the first substrate.

2. The proximity sensor of claim 1, wherein the conductive connectors are solder balls located between the pad of the first substrate and the pad of the processor die.

3. The proximity sensor of claim 2, wherein the second and the third substrates are coupled to a surface of the processor die.

4. The proximity sensor of claim 1, wherein conductive connectors are conductive wires having a first end coupled to the pad of the first substrate and a second end coupled to the pad of the processor die.

5. The proximity sensor of claim 1, wherein the second and the third substrates are coupled to a surface of the encapsulation material.

6. The proximity sensor of claim 1, wherein the light-receiving diode die is electrically coupled to the processor die.

7. The proximity sensor of claim 1, wherein the cap forms a first open cavity and a second open cavity, the light-emitting diode die being in the first open cavity and the light-receiving diode die being in the second open cavity.

8. An optical package comprising:
a first substrate having a first surface, a pad located on the first surface of the substrate;
a processor die having a pad, the processor die coupled to the first surface of the first substrate;
encapsulation material around the processor die, the encapsulation material over the processor die including a recess;
a second substrate in the recess of the encapsulation material, the second substrate having a first surface;
a first optical device coupled to the first surface of the second substrate;
a second optical device located above the encapsulation material; and
a cap located around side surfaces of the first and second optical devices and having sidewalls and an innerwall, the innerwall optically separating the first optical device from the second optical device.

9. The optical package of claim 8, wherein the cap is secured to the first surface of the first substrate.

10. The optical package of claim 8, further comprising encapsulation material around a perimeter of the first surface of the first substrate, wherein the cap is secured to the encapsulation material around the perimeter.

11. The optical package of claim 8, wherein the processor die is coupled to the first surface of the first substrate by solder balls.

12. The optical package of claim 8, wherein the processor die is coupled to the first surface of the first substrate by conductive wires, wherein a first end of the conductive wires are coupled to pads of the processor die and a second end of the conductive wires are coupled to pads on the first surface of the first substrate.

13. The optical package of claim 8, wherein the first optical device is a light-emitting diode die and the second optical device is a light-receiving diode die.

14. The optical package of claim 8, wherein the innerwall of the cap is coupled to the first surface of the second substrate.

15. The optical package of claim 8, wherein the innerwall of the cap is coupled to the encapsulation material over the processor die.

16. A method of making an optical package, the method comprising:
    coupling a processor die to a first surface of a first substrate;
    encapsulating the processor die with encapsulation material;
    securing a second substrate to a surface of the encapsulation material, the second substrate being located above the processor die;
    securing first and second optical devices to the second substrate, the first optical device being spaced apart from the second optical device by a distance; and
    using an adhesive material, coupling an innerwall of a cap to the second substrate between the first and second optical devices and coupling sidewalls of the cap to the first surface of the first substrate, the cap having a first opening above the first optical device and a second opening above the second optical device.

17. The method of claim 16, wherein coupling the processor die to the first surface of the first substrate comprises using adhesive to attach the processor die to the first surface of the first substrate, the method further comprising securing a first end of a conductive wire to a pad of the processor die and a second end of the conductive wire to a pad of the first substrate.

18. The method of claim 16, wherein coupling the processor die to the first surface of the first substrate comprises electrically coupling the processor die to the first surface of the first substrate using flip chip configuration.

19. An electronic device comprising:
    a microprocessor; and
    an optical package, the optical package including:
        a first substrate having a first surface, a pad located on the first surface of the first substrate;
        a processor die having a pad, the processor die coupled to the first surface of the first substrate;
        first conductive connectors coupling the pad of the first substrate to the pad of the processor die;
        encapsulation material over the processor die;
        a light-emitting diode die stacked relative to the processor die;
        a light-receiving diode die stacked relative to the processor die;
        a second conductive connector coupling the light-emitting diode die to the first substrate and a third conductive connector coupling the light-receiving diode die to the first substrate; and
        a cap located around side surfaces of the light-emitting diode die and the light-receiving diode die, the cap having sidewalls and an innerwall, the innerwall optically separating the light-emitting diode die from the light-receiving diode die to form a first open cavity and a second open cavity, the light-emitting diode die and the second conductive connector located in the first open cavity and the light-receiving diode die and the third conductive connector located in the second open cavity.

20. The electronic device of claim 19, further comprising a second substrate coupled to a surface of the encapsulation material, the light-emitting diode die and the light-receiving diode die being secured to a surface of the second substrate.

21. The electronic device of claim 19, further comprising a second substrate coupled to a surface of the encapsulation material and a third substrate coupled to the surface of the encapsulation material, the light-emitting diode die being secured to a surface of the second substrate and the light-receiving diode die being secured to a surface of the third substrate.

22. The electronic device of claim 19, wherein the electronic device is at least one of a cell phone, smartphone, tablet, camera, and wearable computing.

* * * * *